(12) United States Patent
Sarpeshkar

(10) Patent No.: US 6,242,988 B1
(45) Date of Patent: Jun. 5, 2001

(54) SPIKING NEURON CIRCUIT

(75) Inventor: Rahul Sarpeshkar, Cambridge, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/408,377

(22) Filed: Sep. 29, 1999

(51) Int. Cl.[7] .......................................... H03B 5/24
(52) U.S. Cl. ...................... 331/111; 331/177 R; 332/112; 332/113; 327/291
(58) Field of Search ...................... 331/111, 143, 331/177 R; 332/109–111, 112–114; 327/291, 299, 170

(56) References Cited

U.S. PATENT DOCUMENTS 4,723,114 * 2/1988 D'Arrigo et al. .................... 331/111
5,412,350 * 5/1995 Kim ..................................... 331/111

* cited by examiner

*Primary Examiner*—David Mis
(74) *Attorney, Agent, or Firm*—William Ryan

(57) ABSTRACT

A spiking neuron circuit providing a spiking output signal in response to an input current that causes a first capacitor to charge to a threshold voltage. In response to achieving such threshold, an output terminal is connected to a voltage, illustratively $V_{DD}$, for a period determined by an applied voltage, $V_{pw}$. Rapid switching of the output to its spiking level is achieved using a positive feedback path, and deactivation of such feedback rapidly terminates the spiking period.

17 Claims, 3 Drawing Sheets

SPIKING NEURON CIRCUIT

RELATED APPLICATIONS

Subject matter relating to that of the present application is presented in U.S. Patent applications filed on the same day as this application: "Edge-Triggered Toggle Flip-Flop Circuit" by R. Herrera and R. Sarpeshkar; and "Spike-Triggered Asynchronous Finite State Machine," by R. Herrera and R. Sarpeshkar. These applications are assigned to the assignee of the present application and are hereby incorporated by reference in the present application.

FIELD OF THE INVENTION

The present invention relates to electronic circuits, and, more particularly to electronic voltage-controlled and current-controlled oscillator circuits and monostable pulse-generating circuits. Still more particularly, embodiments of the present invention relate to pulse-generating circuits for producing output signals similar to those occurring in neurons in the nervous system of animals.

BACKGROUND OF THE INVENTION

Spiking neuron circuits are inspired by the functioning of neurons in the nervous systems of animals. A simple and effective way of modeling such neurons is as integrate-and-fire units: The neuron integrates input current on a capacitor until the voltage on the capacitor reaches a predetermined threshold voltage. Then, the neuron generates a spike signal and resets the voltage on the capacitor to a reference potential (typically zero voltage, or ground potential). See generally, C. Mead, *Analog VLSI and Neural Systems*, Addison-Wesley, Reading Mass., 1989, especially chapters 4 and 12.

Commercial importance of neuron circuits arises, in part, because they can be used as building blocks in neuronal networks for pattern recognition, as voltage-controlled or current-controlled oscillators, or as monostable pulse-generating circuits. In practice, neuron circuits are often used in arrays, as in U.S. Pat. No. 4,961,002 issued Oct. 2, 1990 to S. M. Tam, et al. It is therefore a useful attribute of neuron circuits that they be fabricated using a small number of devices, and that such devices dissipate a minimum of heat while operating. Yet, many prior implementations of neuron circuits are very complex and consume energy at such levels as to preclude packaging in densities suitable to many tasks.

In operating in an analogous way to biological neurons, neuron circuits often receive input signals from one or more sources, analogous to dendrites in biological contexts. The input signals are typically low-level signals that are often weighted to form logical functions for use in neural networks. A characteristic of most integrate-and-fire circuits is a reset of accumulated input signals upon firing at the output. Prior art neuron circuits typically perform this resetting by involving inputs in a positive feedback loop used in generating the neuron circuit spiking signal. However, such feedback can cause undesirable effects on input signal sources during neuron circuit firing and during a transient period following firing. Such feedback, and the effects of input signals arriving during the output pulse duration, can undesirably alter the charging operations of input capacitors and can adversely affect input signal sources.

Prior art neuron circuits have exhibited limitations respecting the pulse width, shape for neuron circuit outputs and the threshold voltage for neuron circuits. Additionally, it has not proven possible in some neuron circuits to control the refractory period, i.e., the time elapsed between the termination of an output pulse and the generation of a new output pulse.

SUMMARY OF THE INVENTION

Limitations of the prior art are overcome and a technical advance is made in accordance with the present invention described below in illustrative embodiments.

In one illustrative embodiment, a neuron circuit efficiently employs device area by using a small number of transistors and two capacitors. The output pulse width and threshold voltage are adjustable, and the refractory period is illustratively identical to the output spike width. Moreover, during the duration of the spike, the neuron circuit is insensitive to signals appearing at its input.

By judicious adjustment, the illustrative neuron circuit may be used to generate pulse-like waveforms or repetitive sawtooth or triangular waveforms over a very wide range of frequency (typically from rates of a few Hz to hundreds of MHz). For example, the neuron circuit can generate sawtooth waveforms with an adjustable amplitude that vary with the threshold of the neuron circuit.

Importantly, unlike prior topologies, positive feedback responsible for spike firing in the neuron need not directly involve the input in a positive-feedback loop, thereby reducing interference with sensitive analog waveforms at the input of the neuron from noisy output waveforms. A further result of isolation of the noisy output signals from inputs is that it is possible to achieve greater similarity and matching of subthreshold input loads across neurons irrespective of the output state of the neuron.

In an alternative illustrative embodiment input currents are further isolated using a current mirroring arrangement, with the further added advantages that discharge currents need not exceed input currents, thus improving overall energy consumption.

BRIEF DESCRIPTION OF THE DRAWING

Other particular embodiments within the spirit and scope of the attached claims will be apparent to those skilled in the art in light of the following detailed description and the attached drawing, wherein:

DETAILED DESCRIPTION

Figure 1:
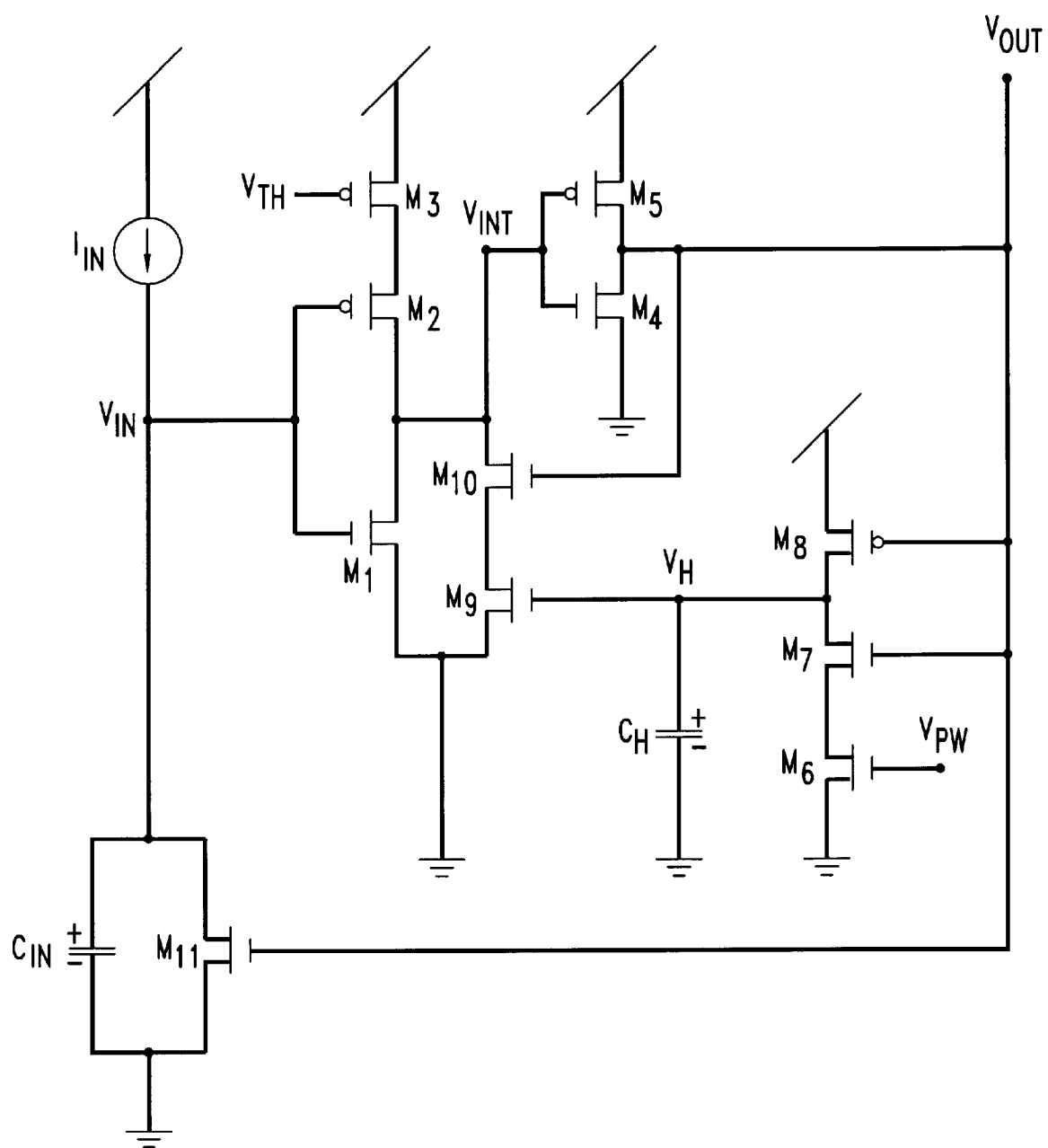
FIG. 1 is a schematic diagram of a first illustrative embodiment of the invention.

FIG. 1 shows the topology of a neuron circuit in accordance with an illustrative embodiment of the invention. In FIG. 1 and elsewhere in the present detailed description, transistors $M_i$ and capacitors $C_x$, for all i and x, are of standard design suitable for manufacture in accordance with a variety of standard processes. Advantageously, MOSFET designs are employed, but any of PMOS, NMOS, CMOS, or a combination of these types of devices may be employed to advantage in particular contexts. In keeping with standard practice, p-channel devices (such as $M_3$) include a "bubble" on the gate, denoting a device that turns on as the gate is made more negative relative to the source. Likewise, the positive power supply is normally positioned at the top of diagrams, with negative voltages at the bottom. So, sources of p-channel devices are at the top, while sources for n-channel devices (such as $M_9$) are at the bottom. See further, for example, Mead, supra, chapter 3.

Returning to FIG. 1, a current $I_{in}$ and a capacitor $C_{in}$ are shown forming an input current and integration capacitor for the neuron, respectively.
Transistors $M_1$, $M_2$, and $M_3$ form an inverter of known design with a threshold that may be adjusted by varying $V_{th}$. A large value of $V_{th}$ (near $V_{DD}$, the voltage of the upper power-supply rail—shown by diagonal lines in FIG. 1) reduces the switching threshold of the inverter, while a small value of $V_{th}$ (near ground) moves the switching threshold of the inverter near $V_{DD}/2$. Transistors $M_4$ and $M_5$ form another inverter, while transistors $M_7$, $M_8$, and $M_6$ form a current-limited inverter, with the limiting current set by the voltage $V_{pw}$. $V_h$, the voltage on capacitor $C_h$, is an internal state variable for the neuron circuit of FIG. 1. A large value of $V_{pw}$ causes a rapid discharge of the voltage $V_h$, while a small value of $V_{pw}$ causes a slow discharge of the voltage $V_h$. Transistors $M_9$ and $M_{10}$ provide positive feedback (gated by $V_h$) around the $M_4$-$M_5$ inverter. Transistor $M_{11}$ resets the voltage on the integration capacitor upon firing of the neuron circuit.

Typical operation of the circuit of FIG. 1 will now be described, assuming that voltage $V_{in}$ is at ground, and voltage $V_h$ is at $V_{DD}$. Current $I_{in}$ starts charging capacitor $C_{in}$ at a rate given by $I_{in}/C_{in}$. When $V_{in}$ reaches the switching threshold of the $M_1$-$M_2$-$M_3$ inverter, this inverter switches towards ground and provides a trigger signal to activate the $M_4$-$M_5$ inverter to switch. The output of the neuron, $V_{out}$ switches toward $V_{DD}$. Since $V_h$ is at $V_{DD}$, $M_9$ and $M_{10}$ form a positive feedback loop that further speeds up the switching response of the neuron circuit.

Voltage $V_{out}$ rapidly reaches $V_{DD}$ and resets the input voltage $V_{in}$ to ground via $M_{11}$. The current through $M_{11}$ when fully on will advantageously be greater than the current $I_{in}$ for the reset to be successful. Also, the current through the series combination of $M_9$ and $M_{10}$ must be greater than that through the series combination of $M_2$ and $M_3$ for the positive feedback to effectively maintain the voltage $V_{out}$ at $V_{DD}$ in spite of the voltage $V_{in}$ being at ground due to the resetting action of $M_{11}$.

While the neuron's voltage $V_{out}$ is at $V_{DD}$, the current-limited inverter formed by $M_6$, $M_7$, and $M_8$ begins to discharge the voltage $V_h$ on capacitor $C_h$ and deactivate the positive feedback. When $V_h$ reaches a voltage such that the current through the series combination of $M_9$ and $M_{10}$ is less than that of the current through the series combination of $M_2$ and $M_3$, the positive feedback is deactivated, voltage $V_{int}$ begins to rise, the $M_4$-$M_5$ inverter switches, and $V_{out}$ falls quickly toward ground, thus terminating the spike at the output of the neuron. The voltage $V_h$ is then reset to $V_{DD}$ by $M_8$. The neuron circuit is now ready to begin its cycle of charging and resetting again.

In functioning in the manner described, the reset of the neuron circuit advantageously occurs on a time scale that is much faster (illustratively 10 times faster) than the time scale of a neuronal pulse. This avoids the possibility of incomplete resetting, where the voltage $V_{out}$ starts falling before $V_{in}$ has reached ground, which weakens the discharge current of the neuron, consequently preventing a complete discharge of $V_{in}$ to ground. To avoid having $V_{in}$ overshoot the threshold of positive-feedback activation by a large amount, $I_{in}$ is advantageously chosen to be sufficiently small such that $V_{in}$ does not increase appreciably during the time delay between the switching of the inverter at the input and the switching of $V_{out}$ to $V_{DD}$.

Figure 2:
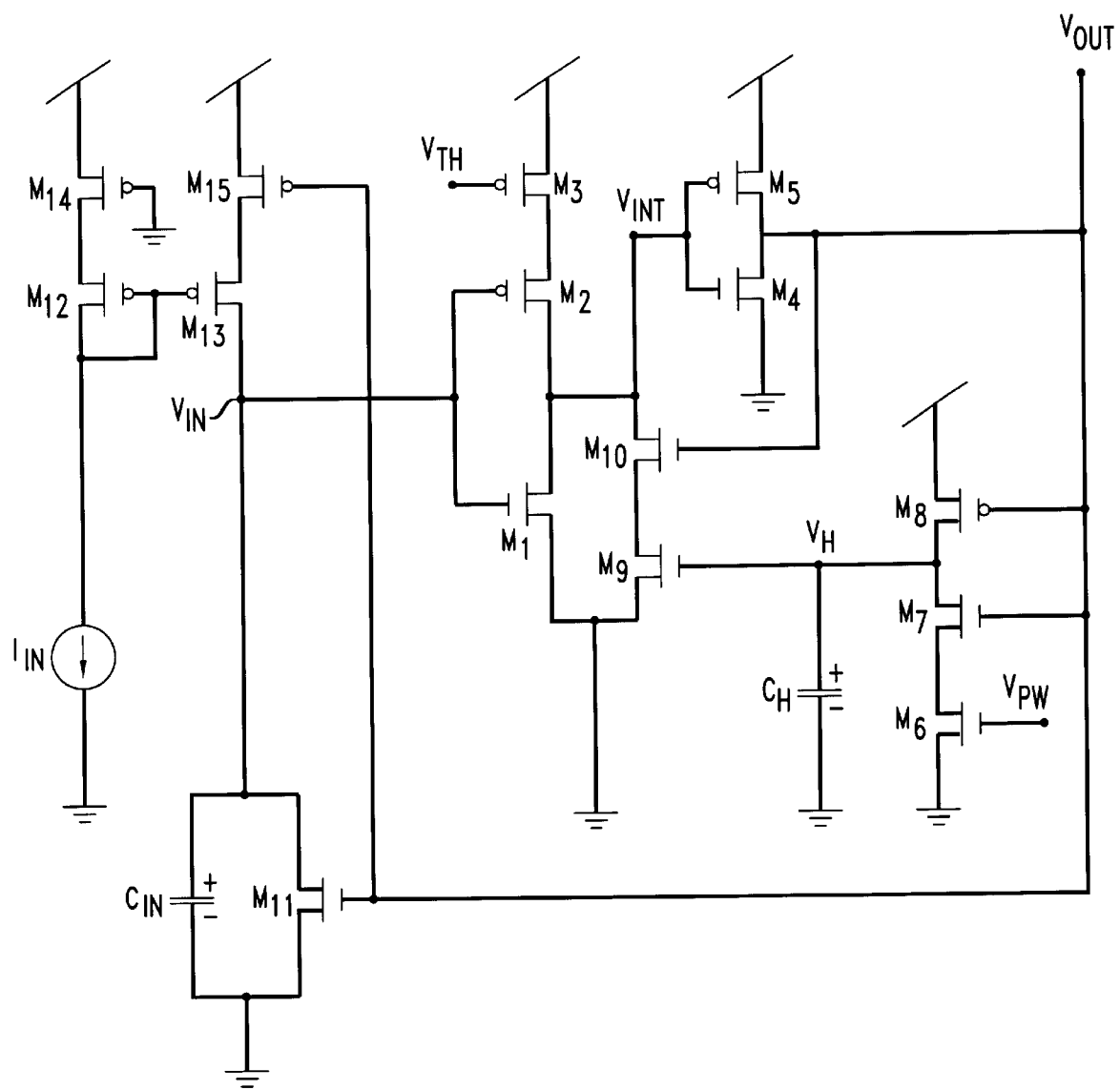
FIG. 2 is a schematic diagram of a second illustrative embodiment of the invention.

FIG. 2 shows an alternative illustrative embodiment of the present invention: a neuron circuit including a modification to the circuit of FIG. 1 comprising addition of transistors $M_{12}$ through $M_{15}$. The four additional transistors form a current mirror for routing $I_{in}$ to the neuron's input. More specifically, input current $I_{in}$ is mirrored by the current from $V_{DD}$ through $M_{13}$ (and so $M_{15}$) to $C_{in}$. (See, for example, the Mead reference, supra, at pp. 39–40.) It will be recognized that transistor $M_{15}$ in FIG. 2 is deactivated by $V_{out}$ during the spiking phase of the neuron, so the input current to the neuron is turned off. Thus, in the topology of FIG. 2, a quick reset does not require the discharge current to be much larger than the input current. The transistor $M_{14}$ ensures that the current mirror is well matched during the charging phase; the gates of transistors $M_{14}$ and $M_{15}$ are both at ground in this phase.

It will be appreciated that the neuron circuit of FIG. 2 is more energy efficient than the circuit of FIG. 1 because, for a given discharge speed, less current is consumed by the circuit. However, it will be noted that the spiking neuron circuits shown in FIGS. 1 and 2 consume no power in the absence of an input current.

Figure 3A:
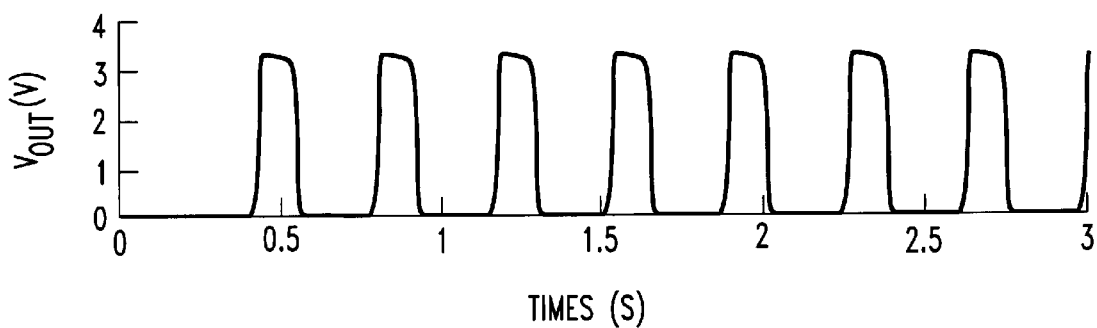
FIGS. 3A–C show illustrative input and output voltages for the circuits of FIGS. 1 and 2, and a particular intermediate voltage, as well.
Figure 3B:
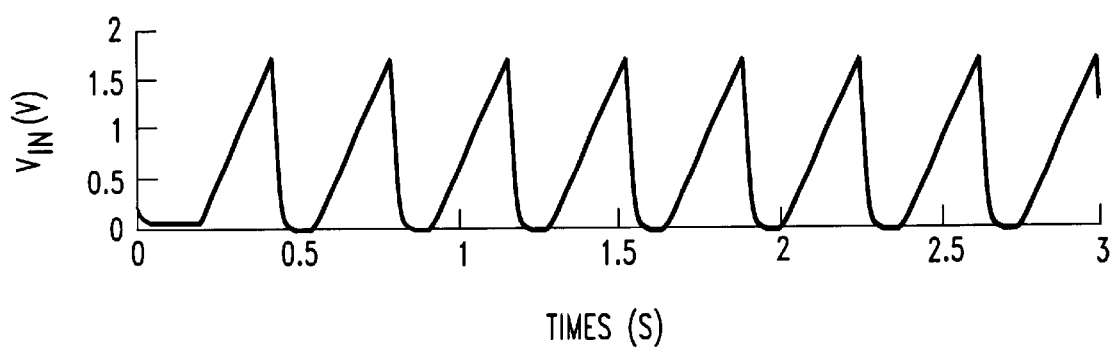
Figure 3C:
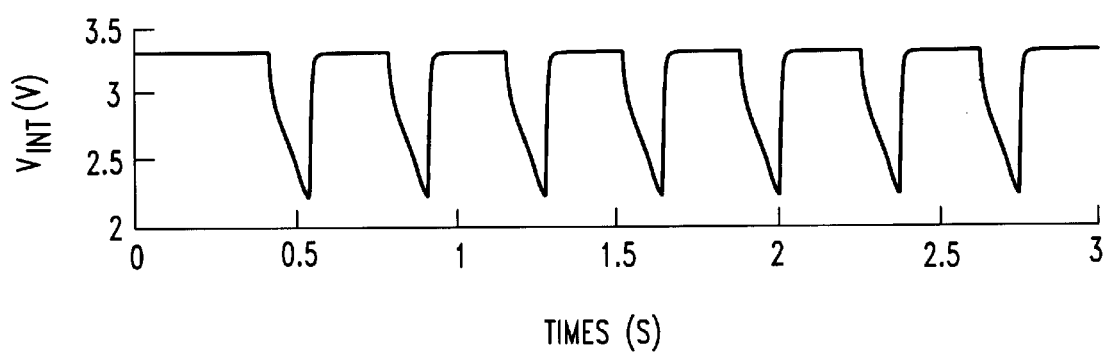

FIG. 3 shows illustrative waveforms for signals appearing in the circuit of FIG. 2 where, for purposes of illustration, $I_{in}=15$ μA, $C_{in}=0.5$ pF, $C_h=0.05$ pF, $V_{pw}=0.92$V, $V_{TH}=1.2$V, and $V_{DD}=3.3$V in a standard illustrative 0.5 μm manufacturing process. The charge-and-reset properties of $V_{in}$ the spiking properties of $V_{out}$ and the discharging-and-charging properties of $V_h$ are evident from FIG. 3. In other illustrative implementations of the circuit of FIG. 2, approximate values of $I^{in}=80$ nA, $C_{in}=0.5$ pF, $V_{pw}=0.69$V, $V_{TH}=1.6$V and $V_{DD}=3.3$V have proven useful. Output pulse width and pulse firing frequency of the circuits of FIGS. 1 and 2 can be varied over many orders of magnitude by changing $V_{pw}$ and $I_{in}$, respectively.

By judicious adjustment, neuron circuits based on the present inventive teachings may be used to generate pulse-like waveforms or repetitive sawtooth or triangular waveforms over a very wide range of frequency (typically from rates of a few Hz to hundreds of MHz). For example, the neuron circuit can generate sawtooth waveforms with an adjustable amplitude that vary with the threshold of the neuron circuit.

Applications for embodiments of the present invention, in addition to those already mentioned, and those associated with circuits and systems described in the above-cited incorporated patent applications, include use of the spike output as a signal marking a timing event. Thus, for example, embodiments of the present invention will serve as a self-triggered asynchronous timing event from a particular input. In particular applications it proves advantageous to have the refractory period of illustrative pulse circuits equal to (or having a predetermined relationship to) the spike width. With such appropriate refractory period selected, inhibition of further input to the neuron can be achieved while other parts of a system finish responding to a spiking signal and settle to new levels. In this manner, spikes generated in embodiments of the present invention may serve in a manner analogous to clock transitions in traditional digital systems.

The input $I_{in}$ to embodiments of the present invention, may be supplied by linear or nonlinear functions of single or multiple input signals. In some applications, such as typical neural network pattern recognition systems, a neural threshold element based on the present inventive teachings may derive its input current based on a weighted linear combination of other particular signals.

Those skilled in the art will appreciate that the example device types, manufacturing processes, polarities and circuit parameter values are merely illustrative. Other particular types, processes, polarities and values will prove to be of value in particular applications employing the present invention.

What is claimed is:

1. An electronic neuron circuit comprising
   an output terminal initially at a first voltage,
   a first capacitor for charging to a voltage $V_{in}$ in response to at least one input current,
   a first threshold circuit having a switching threshold $V_{th}$ for producing a first trigger signal when said $V_{in} > V_{th}$,
   first circuit means responsive to said first trigger signal for driving said output terminal from said first voltage toward a spiking voltage,
   means responsive to said voltage at said output terminal being driven toward said spiking voltage for resetting $V_{in}$ to a value less than said $V_{th}$, and
   first feedback means responsive to said voltage at said output terminal being driven toward said spiking voltage for speeding up said driving of said output terminal toward said spiking voltage.

2. The neuron circuit of claim 1 wherein said spiking voltage is substantially equal to a supply voltage.

3. The neuron circuit of claim 2 wherein said supply voltage is equal to $V_{DD}$.

4. The neuron circuit of claim 1 wherein said first circuit means further comprises an inverter for connecting said output terminal to a supply voltage in response to said trigger signal.

5. The neuron circuit of claim 4 wherein said inverter comprises means for connecting said output terminal to said supply voltage through at least one active device.

6. The neuron circuit of claim 1 further comprising
   a second capacitor initially charged to a second voltage substantially equal to a supply voltage, and
   a current limiting inverter connected to said output terminal for discharging said second capacitor at a rate controlled by a voltage $V_{pw}$, after said output terminal is driven toward said spiking voltage, and
   means for disconnecting said first feedback means after said second capacitor has been discharged to a predetermined voltage.

7. The neuron circuit of claim 6 further comprising means responsive to said disconnecting of said first feedback means for returning said output voltage to said first voltage.

8. The neuron circuit of claim 7 further comprising means responsive to said output voltage returning to said first voltage for returning said second capacitor to said second voltage.

9. The neuron circuit of claim 1 wherein said means for resetting $V_{in}$ to a value less than said $V_{th}$ comprises a switch responsive to said voltage at said output terminal being driven toward said spiking voltage, said switch applying a reference voltage to said first capacitor.

10. The neuron circuit of claim 9 wherein said reference voltage is ground.

11. The neuron circuit of claim 7 wherein said means for resetting $V_{in}$ to a value less than said $V_{th}$ comprises a switch responsive to said voltage at said output terminal being driven toward said spiking voltage, said switch connecting said capacitor to a reference voltage, said switch being further responsive to said output terminal being returned to said first voltage for disconnecting said reference voltage from said first capacitor.

12. The neuron circuit of claim 1 further comprising a current mirror circuit for mirroring said at least one input current for application to said first threshold circuit.

13. The neuron circuit of claim 12 wherein said current mirror circuit comprises means responsive to said output terminal being driven toward said spiking voltage for disconnecting said at least one input current while said output terminal is not at a voltage substantially equal to said first voltage.

14. A timing circuit for generating spiking pulses at an output terminal in response to at least one input current, said output terminal initially being at a first voltage, comprising
   a first capacitor for charging to a voltage $V_{in}$ in response to applied currents,
   means for selectively applying said at least one input current to said first capacitor,
   a first threshold circuit having a switching threshold $V_{th}$ for producing a first trigger signal when said $V_{in} > V_{th}$,
   first circuit means responsive to said first trigger signal for driving said output terminal from said first voltage toward a spiking voltage, said spiking voltage being substantially different from said first voltage,
   means responsive to said voltage at said output terminal being driven toward said spiking voltage for resetting $V_{in}$ to a value less than said $V_{th}$,
   means for disconnecting said means for selectively applying when said output terminal is at a voltage substantially different from said first voltage,
   means for restoring said output voltage to said first voltage after a predetermined period, thereby reconnecting said means for selectively applying,
   a second capacitor initially charged to a second voltage substantially equal to a supply voltage,
   said first circuit means comprising feedback means for speeding up said driving of said voltage at said output terminal toward said spiking voltage, said feedback means being responsive to the voltage on said second capacitor, and
   said means for restoring comprising means for controlling said voltage on said second capacitor.

15. The timing circuit of claim 14 wherein said means for selectively applying said input currents to said first capacitor comprises means for applying a weighted combination of a plurality of input currents.

16. The timing circuit of claim 14 wherein said means for selectively applying comprises at least one current mirror circuit.

17. The timing circuit of claim 14 wherein said means for controlling comprises
   a current limiting inverter for discharging said second capacitor after said output terminal is driven toward said spiking voltage, said discharging being at a rate determined by a voltage $V_{pw}$, and
   means for disconnecting said feedback means after said second capacitor has been discharged to a predetermined voltage.

* * * * *